United States Patent [19]

Terakawa et al.

[11] Patent Number: 4,901,042
[45] Date of Patent: Feb. 13, 1990

[54] HIGH FREQUENCY POWER DIVIDER

[75] Inventors: Takashige Terakawa; Noriyuki Akaba; Sadayoshi Hattori, all of Yokohama, Japan

[73] Assignee: Tokyo Keiki Co., Tokyo, Japan

[21] Appl. No.: 169,424

[22] Filed: Mar. 17, 1988

[30] Foreign Application Priority Data

Apr. 1, 1987 [JP] Japan .................................. 62-80161

[51] Int. Cl.$^4$ ............................................. H01P 5/12
[52] U.S. Cl. ..................................... 333/127; 333/128
[58] Field of Search ............... 333/124, 125, 127, 128, 333/136

[56] References Cited

U.S. PATENT DOCUMENTS 4,401,955 8/1983 Yorinks et al. ...................... 333/127

FOREIGN PATENT DOCUMENTS 57501 4/1984 Japan .................................... 333/125

Primary Examiner—Paul Gensler
Attorney, Agent, or Firm—Sandler & Greenblum

[57] ABSTRACT

A high-frequency power divider having an input line, a pair of input-output lines, and a pair of high-impedance transmission lines diverging from the input line and interconnecting the first and second input-output lines. An isolation resistor is interposed between and connected to a pair of portions of the high-impedance transmission lines proximate the input-output lines. A capacitive component, corresponding to the capacitive component of the resistor, is provided at a diverging point at which the high-impedance transmission lines diverge from the first input-output line. The second capacitive component is defined by a capacitor or electrode surface.

6 Claims, 4 Drawing Sheets

F I G. 1
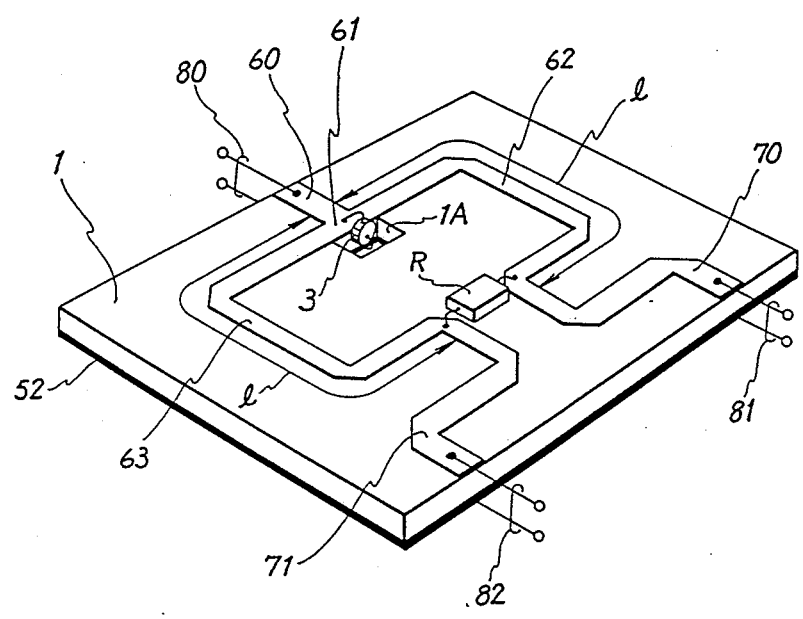

HIGH FREQUENCY POWER DIVIDER

BACKGROUND OF THE INVENTION

1. Field of the Invention

This invention relates to a high-frequency power divider and, more particularly, to a high-frequency power divider having an isolation resistor at its output side.

2. Description of the Prior Art

In general, a dual-distribution type power divider comprises a flat microwave circuit used as a power divider for distributing or synthesizing high-frequency power. FIGS. 5-(1) and 5-(2) show an example of this circuit.

Referring to FIG. 5-(2), a desired pattern of a power divider circuit is formed on one of two surfaces of a dielectric base 50 in the form of a plate. An earth plate (also known as "ground plate") 52 is attached to the other surface of the dielectric base 50 so that it uniformly covers this surface.

The circuit pattern is formed of a single input-output line 60 which comprises an input stage, a pair of input-output lines 70 and 71 which comprise an output stage, a pair of high-impedance transmission lines 62 and 63 which diverge from the input-output line 60 of the input stage at a diverging point 61 and extends to the input-output lines 70 and 71 of the output stage. An isolation resistor R is interposed between and connected to a pair of output-side portions of the high-impedance transmission lines 62 and 63.

The impedance of each of the input-output line 60 of the input stage and the input-output lines 70 and 71 of the output stage is set to Z [Ω], and the impedance of each of the high-impedance transmission lines 62 and 63 is set to $\sqrt{2}\cdot Z$. A length l of each of the high-impedance transmission lines 62 and 63 is determined on the basis of an equation:

$$l = (2n+1)\cdot \lambda g/4$$

where n=0, 1, 2, ..., and λg is the wavelength at the operation frequency.

A reference character 80 denotes an input-output terminal of the input disposed at the input side, and reference characters 81 and 82 denote input-output terminals disposed at the output side.

The example of the conventional device shown in FIG. 5-(2) is represented in an ideal state by an equivalent circuit shown in FIG. 5-(1). In this case, electric power input into the input-output terminal 80 is equally distributed to the input-output terminals 81 and 82. The phase difference between distributed electric powers at input-output terminals 81 and 82 is 0°. Conversely, if electric powers of equal levels are input into the input-output terminals 81 and 82 in phase, an electric power which is synthesized from the input electric powers is obtained at the input-output terminal 80. In this case, since the phases of the two electric powers are equal to each other, no potential difference occurs across the isolation resistor R, and no current flows through the resistor. For this reason, the electric power divider can also serve as an electric power synthesizer.

In the circuit shown in FIG. 5-(1) and, hence, in the ideal state, part of an input supplied through one of the input-output terminals 81 and 82 appears at the input-output terminal 80 while the remaining part is all absorbed by the resistor R so that no power appears at the other one of the input-output terminals 81 and 82.

However, since in the above-described conventional device, the whole of the circuit is provided in the form of a planar microwave circuit on the dielectric base 50, as shown in FIG. 5-(2), each power line for transmitting electric power actually has a uniformly distributed capacitive component. In particular, a predetermined capacitive component C relative to the earth plate 52 is fixed to the reverse surface of the base, attached to the isolation resistor R, as shown in FIG. 5-(3). An impedance mismatch thereby occurs at each of the input-output terminals 80, 81, and 82 so that the input VSWR characteristics deteriorate and reflection waves are increased.

SUMMARY OF THE INVENTION

It is therefore an object of the present invention to provide a high-frequency power divider which is free from the above-mentioned problem of the conventional device, and which has circuit characteristics substantially equal to those realized in the ideal state and is not affected by a capacitive component formed by the isolation resistor R, irrespective of the capacitance value thereof.

To this end, the present invention provides a high-frequency power divider comprising a dielectric base in the form of a plate having an earth surface formed on its reverse side; a first input-output line constituting a single input terminal; a pair of second input-output lines of the same impedance branching from the first input-output line and constituting two output terminals; a pair of high-impedance transmission lines diverging and extending from the first input-output line to the second input-output lines; an isolation resistor having a predetermined first capacitive component and interposed between and connected to a pair of portions of the high-impedance transmission lines at the side of the second input-output lines, the high-frequency power divider being characterized by having a second capacitive component for canceling reflection caused by the first capacitive component.

BRIEF DESCRIPTION OF THE DRAWINGS

FIG. 1 is a perspective view of a first embodiment of the present invention;

DESCRIPTION OF THE PREFERRED EMBODIMENTS

Figure 2:
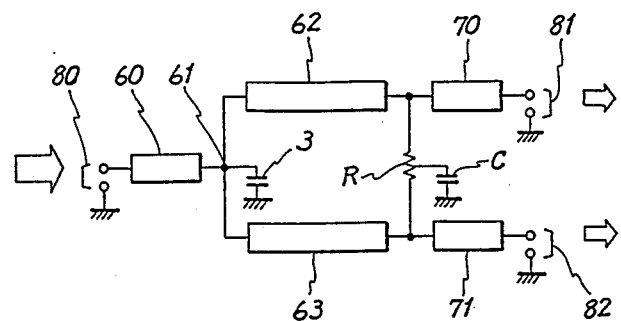
FIG. 2 is a circuit diagram of the device shown in FIG. 1.
Figure 5:
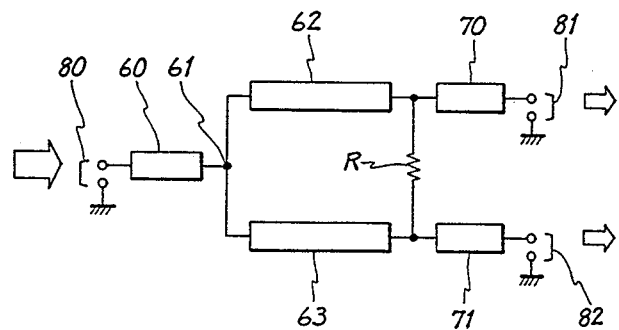
FIGS. 5-(1), 5-(2), and 5-(3) are diagrams of an example of a conventional device.
Figure 5:
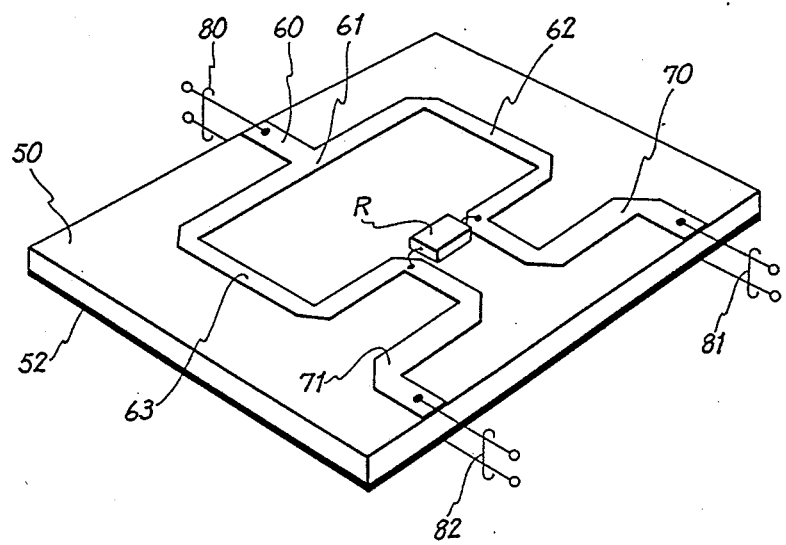
Figure 5:
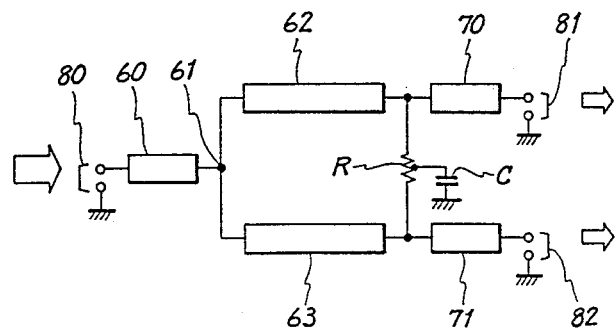

Referring to FIGS. 1 and 2, a first embodiment of the present invention is illustrated. Components identical to those described above in connection with FIG. 5 are indicated by the same reference characters.

As shown in FIG. 1, a desired pattern of a power divider circuit is formed on one of two surfaces of a dielectric base 1 in the form of a plate. An earth plate 52 is attached to the other surface of the dielectric base 1 so that it uniformly covers this surface.

The circuit pattern is similar to that of the above-described conventional device and is formed of a first input-output line 60 which comprises an input stage, a pair of second input-output lines 70 and 71 which comprise an output stage, a pair of high-impedance transmission lines 62 and 63 which diverge from the input-output line 60 of the input stage at a diverging point 61 and extends to the input-output lines 70 and 71 of the output stage. An isolation resistor R is interposed between and connected to a pair of output-side portions of the high-impedance transmission lines 62 and 63.

A through hole 1A is formed in a portion of the dielectric base 1 adjacent to the diverging point 61. A compensation capacitor 3, provided as a capacitive component having a desired capacitance value, is interposed between and connected to the diverging point 61 and the earth plate 52 of the dielectric base 1. Except for this point, the construction of this embodiment is the same as that of the above-described conventional device.

If, during operation, a capacitance C occurs as shown in FIG. 2 by the influence of the isolation resistor R, the compensation capacitor 3 disposed at the diverging point 61 functions to effectively cancel reflections caused by the capacitance C, thereby improving the input VSWR at each of the input-output terminal 80 and the pair of input-output terminals 81 and 82.

That is, the disposition of the compensation capacitor 3 at the diverging point 61 ensures that the phase of reflection caused by the capacitance C and that of reflection caused by the compensation capacitor 3 are substantially equal to each other because of characteristics thereof. Therefore, the phase of one of the two reflections, after going and returning, differs from that of the other by an angle corresponding to the half wavelength (because the length of each of the high-impedance transmission lines 62 and 63 corresponds to a one-fourth wavelength) so that these reflections cancel each other by being added to each other with phase difference of 180° in a vector addition manner at the input-output terminal 80, 81, and 82.

As described above, in accordance with the present invention, even if the capacitive component formed at the isolation resistor R has a comparatively large value, reflections caused by this capacitive component can be effectively canceled, thereby enabling the input VSWR characteristics to be improved. Therefore, the invention makes it possible to apply to the resistance R a resistance having improved power-withstanding properties and a comparatively high resistance value, thus providing a high-power divider having improved characteristics.

Figure 3:
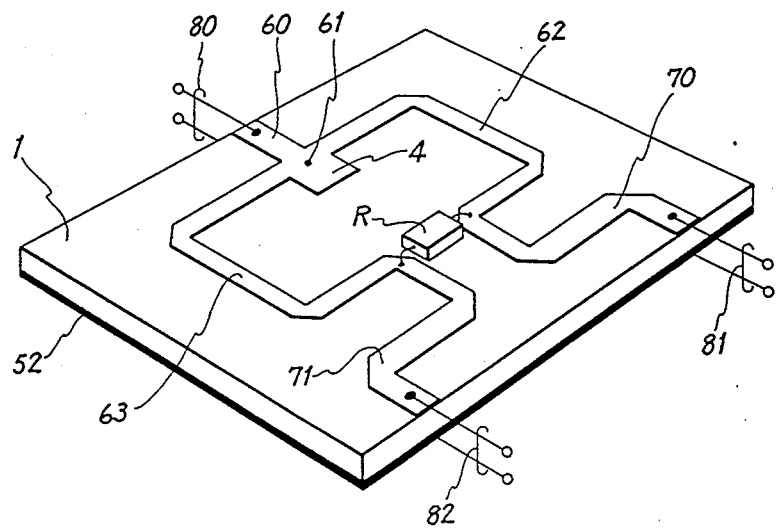
FIG. 3 is a perspective view of a device which represents a second embodiment.

A second embodiment of the present invention will be described below with reference to FIG. 3.

In this embodiment, the circuit pattern of the dielectric base 1 has an electrode pattern portion 4, which is formed at the diverging point 61 in such a manner as to pattern portion defines a parallel-plate capacitor to provide a capacitive component for compensation by facing the earth plate 52 attached to the reverse surface of the base. Thus, in the second embodiment, the formation of a hole like the through hole 1A of the first embodiment in the dielectric base 1 is not needed. Except for this point, the construction is the same as that of the first embodiment.

The second embodiment enables the same functions and effects as those realized by the first embodiment and is further advantageous in that the device in accordance with the second embodiment can be formed by a conventional manufacturing process because the electrode pattern portion 4 can be formed simultaneously with the formation of the main circuit pattern for providing micro-strip lines, thereby enabling a device having a capacitive component for compensation equivalent to that of the first embodiment to be manufactured at the same cost as that of the conventional device.

A third embodiment of the present invention will be described below with reference to FIG. 4. In this embodiment, a power divider is constructed on the basis of the circuit diagram of FIG. 2 by using coaxial cables.

Figure 4:
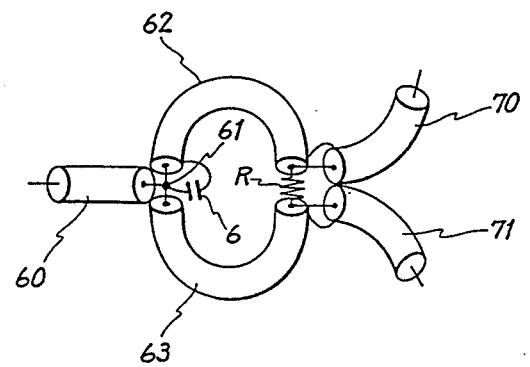
FIG. 4 is a diagram of the construction of a third embodiment of the present invention.

The input-output line 60 of the input stage, the input-output lines 70 and 71 of the output stage and the intermediate high-impedance transmission lines 62 and 63 are formed of coaxial cables, as shown in FIG. 4. The impedance value of each of these component is the same as that of the corresponding component of each of the above-described embodiment.

This arrangement also enables the same functions and effects as those realized by the first embodiment by disposing a compensation capacitor 6 at the diverging point 61 of the input-output line 60.

In the power divider having the above-described construction and functions, reflection caused by the isolation resistor can be effectively canceled, thereby improving VSWR characteristics and enabling the use of a large-size resistance for isolation. The present invention thus provides a high-frequency power divider having a large capacity and improved characteristics.

What is claimed is:

1. A high-frequency power divider, comprising:
   a dielectric base having a ground formed on one side of said dielectric base;
   an input line formed on a second side of said dielectric base;
   a pair of input-output lines formed on said second side of said dielectric base, said input-output lines forming a pair of output terminals;
   a pair of high-impedance transmission lines formed on said second side of said dielectric base that diverge from each other at a side opposite where high-frequency power is inputted into said input line, said pair of impedance transmission lines extending to said pair of input-output lines;
   an isolation resistor having one end thereof connected to one of said pair of high-impedance transmission lines, the remaining end of said isolation resistor being connected to the remaining high-impedance transmission line; and
   a capacitive component comprising a capacitor disposed at an inner side where said high-impedance transmission lines diverge from said input line, said capacitive component cancelling undesired reflections along said high-frequency power divider.

2. The high-frequency power divider of claim 1, wherein said capacitor is disposed inside a hole formed in said dielectric base.

3. The high-frequency power divider of claim 1, wherein said capacitor comprises an electrode pattern portion formed on said second side of said dielectric base, said electrode pattern having a predetermined shape.

4. A high frequency power divider, comprising:
   a coaxial cable input line having an input end and a diverging end;
   a pair of coaxial cable input-output lines, each input-output line having a first end and an output end, an outer conductor of each input-output line being connected to an outer conductor of said input line;

a pair of coaxial cable high-impedance transmission lines, one end of each high-impedance transmission line being connected to said diverging end of said input line, the remaining end of one high-impedance transmission line being secured to said first end of one input-output line and the remaining end of the second high-impedance transmission line being secured to said first end of the remaining input-output line, an outer conductor of each high-impedance transmission line being connected to said outer conductor of said input-output lines;

an isolation resistor connected between said input-output lines; and a capacitive component disposed at an inner side of said pair of high-impedance transmission lines that diverge from said input line to cancel undesired reflections along said power divider.

5. A high frequency power divider, comprising:

a coaxial cable input line having an input end and a diverging end;

a pair of coaxial cable input-output lines, each input-output line having a first end and an output end, an outer conductor of each input-output line being connected to an outer conductor of said input line;

a pair of coaxial cable high-impedance transmission lines, one end of each high-impedance transmission line being connected to said diverging end of said input line, the remaining end of one high-impedance transmission line being secured to said first end of one input-output line and the remaining end of the second high-impedance transmission line being secured to said first end of the remaining input-output line, an outer conductor of each high-impedance transmission line being connected to said outer conductor of said input-output lines;

an isolation resistor connected between said input-output lines; and a capacitor positioned at an inner side of said point where said pair of high-impedance transmission lines diverge from said input line for cancelling undesired reflections along said power divider.

6. A high-frequency power divider, comprising:

a dielectric base having a ground formed on one side of said dielectric base;

an input line formed on a second side of said dielectric base;

a pair of input-output lines formed on said second side of said dielectric base, said input-output lines forming a pair of output terminals;

a pair of high-impedance transmission lines formed on said second side of said dielectric base that diverge from each other at a side opposite where high-frequency power is inputted into said input line, said pair of impedance transmission lines extending to said pair of input-output lines, each high-impedance transmission line comprising:

a first section that extends perpendicular to said input line;

a second section that is formed perpendicular to said first section so that said high-impedance transmission lines are parallel to each other, said section being located between said input line and said input-output lines;

a third section that is formed perpendicular to said second section so that said high-impedance transmission lines converge towards each other until said high-impedance transmission lines are separated from each other by a predetermined minimum distance;

a fourth section that diverges from said third section towards one of said input-output lines, the length of said first, second and third sections of each high-impedance transmission line being chosen so that each transmission line has a desired impedance;

an isolation resistor having one end thereof connected to one of said pair of high-impedance transmission lines, the remaining end of said isolation resistor being connected to the remaining high-impedance transmission line, said resistor being located proximate said input-output lines proximate said predetermined minimum distance between each high-impedance transmission line; and a capacitive component disposed at an inner side where said high-impedance transmission lines diverge from said input line, said capacitive component cancelling undesired reflections along said high-frequency power divider.

* * * * *